(12) United States Patent
Dorok et al.

(10) Patent No.: US 11,653,557 B2
(45) Date of Patent: *May 16, 2023

(54) ORGANIC ELECTRONIC DEVICE

(71) Applicant: Novaled GmbH, Dresden (DE)

(72) Inventors: Sascha Dorok, Dresden (DE); Mike Zoellner, Dresden (DE); Carsten Rothe, Dresden (DE); Omrane Fadhel, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/185,905

(22) Filed: Feb. 25, 2021

(65) Prior Publication Data

US 2021/0184124 A1 Jun. 17, 2021

Related U.S. Application Data

(62) Division of application No. 16/406,319, filed on May 8, 2019, now Pat. No. 11,251,379, which is a division of application No. 14/361,205, filed as application No. PCT/EP2012/074125 on Nov. 30, 2012, now Pat. No. 10,297,767.

(30) Foreign Application Priority Data

Nov. 30, 2011 (EP) .................... 11191350

(51) Int. Cl.
| | |
|---|---|
| H10K 85/30 | (2023.01) |
| H10K 30/00 | (2023.01) |
| H10K 50/00 | (2023.01) |
| H10K 50/165 | (2023.01) |
| H10K 50/17 | (2023.01) |

(52) U.S. Cl.
CPC ........... *H10K 85/322* (2023.02); *H10K 30/00* (2023.02); *H10K 50/00* (2023.02); *H10K 85/30* (2023.02); *H10K 85/361* (2023.02); *H10K 85/381* (2023.02); *H10K 50/165* (2023.02); *H10K 50/171* (2023.02); *Y02E 10/549* (2013.01)

(58) Field of Classification Search
None
See application file for complete search history.

(56) References Cited

U.S. PATENT DOCUMENTS

| | | | |
|---|---|---|---|
| 6,013,384 A | 1/2000 | Kido et al. | |
| 6,127,192 A | 10/2000 | Uhlenbrock et al. | |
| 6,589,673 B1 | 7/2003 | Kido et al. | |
| 6,870,868 B2 | 3/2005 | Kahen et al. | |
| 7,074,500 B2 | 7/2006 | Pfeiffer et al. | |
| 7,601,437 B2 | 10/2009 | Lin | |
| 8,367,221 B2 | 2/2013 | Qiu et al. | |
| 8,658,832 B2 | 2/2014 | Yersin et al. | |
| 10,297,767 B2 | 5/2019 | Dorok et al. | |
| 11,251,379 B2 * | 2/2022 | Dorok | H01L 51/42 |
| 2004/0001969 A1 | 1/2004 | Cosimbescu et al. | |
| 2007/0018154 A1 | 1/2007 | Bae et al. | |
| 2007/0138950 A1 | 6/2007 | Yamamoto et al. | |
| 2007/0196688 A1 | 8/2007 | Ikeda et al. | |
| 2007/0022237 A1 | 9/2007 | Arakane et al. | |
| 2007/0267970 A1 | 11/2007 | Yamamoto et al. | |
| 2008/0111473 A1 | 5/2008 | Kawamura et al. | |
| 2008/0227979 A1 | 9/2008 | Saalbeck et al. | |
| 2009/0212280 A1 | 8/2009 | Werner et al. | |
| 2009/0217980 A1 | 9/2009 | Pfeiffer et al. | |
| 2009/0235971 A1 | 9/2009 | Pfeiffer et al. | |
| 2009/0278115 A1 | 11/2009 | Hosokawa et al. | |
| 2010/0117521 A1 | 5/2010 | Yersin et al. | |
| 2010/0123390 A1 | 5/2010 | Kamatani et al. | |
| 2010/0157131 A1 | 6/2010 | Kamatani et al. | |
| 2011/0006294 A1 | 1/2011 | Tanaka et al. | |
| 2019/0267546 A1 * | 8/2019 | Dorok | H01L 51/0077 |

FOREIGN PATENT DOCUMENTS

| | | |
|---|---|---|
| EP | 2312663 | 4/2011 |
| JP | 2002-063989 | 2/2002 |
| JP | 2005142122 A | 6/2005 |
| JP | 2007088015 A | 4/2007 |
| WO | 98/006242 A1 | 2/1998 |
| WO | 98/55561 A1 | 12/1998 |
| WO | 00/18851 A1 | 4/2000 |
| WO | 03/088271 A1 | 10/2003 |
| WO | 2011/154131 A1 | 12/2011 |

OTHER PUBLICATIONS

"Notice to File a Response," dated Nov. 18, 2021, in Korean Patent Application No. 10-2021-7033948 (English translation).
Shipley, C.P. et al. "Orange Electroluminescence from a Divalent Europium Complex", Advanced Materials, 1999, 11(7), 533-536.
European Search Report for EP Application No. 18177915 dated Sep. 28, 2018 (7 pages).
Korean Office Action for KR Application No. 10-2014-7018176 dated Dec. 12, 2018 (6 pages) (English translation).
Taiwanese Office Action for TW Application No. 105138721 dated Mar. 28, 2017 (9 pages) (English translation).

(Continued)

*Primary Examiner* — Joseph R Kosack
(74) *Attorney, Agent, or Firm* — Eversheds Sutherland (US) LLP

(57) ABSTRACT

The present invention relates to an organic electronic device, comprising a first electrode, a second electrode, and a substantially organic layer comprising a compound according to formula (I) between the first and the second electrode:

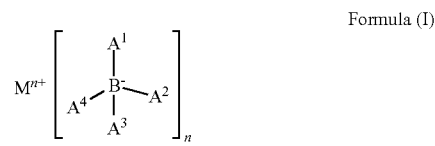

Formula (I)

wherein M is a metal ion, each of $A^1$-$A^4$ is independently selected from H, substituted or unsubstituted C6-C20 aryl and substituted or unsubstituted C2-C20 heteroaryl and n is valency of the metal ion.

12 Claims, 1 Drawing Sheet

(56) References Cited

OTHER PUBLICATIONS

Chinese Office Action for CN Application No. 201280058258.6 dated Dec. 13, 2016 (11 pages) (English translation).
Japanese Office Action for JP Application No. 2014-543920 dated Sep. 13, 2016 (3 pages) (English translation).
Chinese Office Action for CN Application No. 201280058258.6 dated Apr. 6, 2016 (10 pages) (English translation).
PCT International Search Report for PCT Application No. PCT/Ep2012/074125 dated Mar. 5, 2013 (3 pages).
PCT International Preliminary Report on Patentability dated Jun. 12, 2014 (7 pages).
Lee et al., "Effects of Hydroxyl Groups in Polymeric Dielectrics on Organic Transistor Performance," Applied Physics Letters, 2006, 88:162109-1 to 162109-3.
Trofimenko, "Boron-Pyrazole Chemistry. II. Poly(1-pyrazolyl)borates," Journal of the American Chemical Society, 89(13):3170-3177, 1967.
Chinese Office Action for CN Application No. 201810073328.4 dated Jun. 4, 2019 (8 pages, English translation).
Japanese Office Action for JP Application No. 2017-167485 dated Sep. 25, 2018 (16 pages, English ranslation).
Japanese Office Action for JP Application No. 2017-167485 dated Aug. 27, 2019 (7 pages, English translation).

* cited by examiner

ORGANIC ELECTRONIC DEVICE

CROSS-REFERENCE TO RELATED APPLICATIONS

This is a divisional application of U.S. patent application Ser. No. 16/406,319, filed May 8, 2019, which is a divisional application of U.S. patent application Ser. No. 14/361,205, filed May 28, 2014, now U.S. Pat. No. 10,297,767, which is a U.S. national stage application of International Application No. PCT/EP2012/074125, filed Nov. 30, 2012, which claims priority to European Application No. 11 191 350.5, filed Nov. 30, 2011. The contents of these applications are hereby incorporated by reference.

FIELD OF THE INVENTION

The present invention relates to an organic electronic device and to a use of a specific compound in such an organic electronic device.

BACKGROUND

Organic electronic devices, such as organic semiconductors, can be used to fabricate simple electronic components, e.g. resistors, diodes, field effect transistors, and also optoelectronic components like organic light emitting devices (e.g. organic light emitting diodes (OLED)), and many others. The industrial and economical significance of the organic semiconductors and their devices is reflected in the increased number of devices using organic semiconducting active layers and the increasing industry focus on the subject.

OLEDs are based on the principle of electroluminescence in which electron-hole pairs, so-called excitons, recombine under the emission of light. To this end the OLED is constructed in the form of a sandwich structure wherein at least one organic film is arranged as active material between two electrodes, positive and negative charge carriers are injected into the organic material and a charge transport takes place from holes or electrons to a recombination zone (light emitting layer) in the organic layer where a recombination of the charge carrier to singlet and/or triplet excitons occurs under the emission of light. The subsequent radiant recombination of excitons causes the emission of the visible useful light emitted by the light-emitting diode. In order that this light can leave the component at least one of the electrodes must be transparent. Typically, a transparent electrode consists of conductive oxides designated as TCOs (transparent conductive oxides), or a very thin metal electrode; however other materials can be used. The starting point in the manufacture of an OLED is a substrate on which the individual layers of the OLED are applied. If the electrode nearest to the substrate is transparent the component is designated as a "bottom-emitting OLED" and if the other electrode is designed to be transparent the component is designated as a "top-emitting OLED". The layers of the OLEDs can comprise small molecules, polymers, or be hybrid.

Several operational parameters of the OLED are being constantly improved to enhance the overall power efficiency. One important parameter is the operation voltage which can be tuned by improving the transport of charge carriers and/or reducing energy barriers such as the injection barriers from the electrodes, another important figure is the quantum efficiency, and also very relevant is the lifetime of the device. Other organic devices, such as organic solar cells also require improving in efficiency, which nowadays, are at best about 9%.

Like an OLED, an organic solar cell has a stack of organic layers between two electrodes. In a solar cell, there must be at least one organic layer responsible for the absorption of light and a interface which separates the excitons created by the absorption (photo-active). The interface can be a bi-layer heterojunction, a bulk-heterojunction, or can comprise more layers, e.g., in a step wise interface. Also sensitizing layers and others can be provided. For increased efficiency, a good charge carrier transport is required, in some device structures the transport regions must not absorb light, therefore transport layers and photo-active layers may comprise different materials. Also charge carrier and/or exciton blocking layers may be employed. Highest efficiency solar-cells are, nowadays, multi-layer solar cells, some device structures are stacked (multi-junction solar cells) and connected by a connecting unit (also called recombination layer); nevertheless, single junction solar cells could have a high performance if the right materials were found. Examples of devices are given in US2009217980, or in US2009235971.

Differently than OLEDs and organic solar cells, transistors do not require doping of the entire semiconducting (channel) layer, because the concentration of available charge carriers is determined by an electric field supplied by a third electrode (gate electrode). However, convention organic thin film transistors (OTFTs) require very high voltages to operate. There is a need to lower this operating voltage; such an optimization can be done, e.g. with appropriate injection layers.

Organic transistors are also called organic field-effect transistors. It is anticipated that a large number of OTFTs can be used for example in inexpensive integrated circuits for non-contact identification tags (RFID) but also for screen control. In order to achieve inexpensive applications, generally thin-layer processes are required to manufacture the transistors. In recent years performance features have been improved to such an extent that the commercialization of organic transistors is foreseeable. For example, in OTFTs high field-effect mobilities of up to 5.5 cm2/Vs for holes on the basis of pentacene (Lee et al., Appl. Lett. 88, 162109 (2006)) have been reported. A typical organic field-effect transistor comprises an active layer of organic semiconducting material (semiconducting layer) material which during the operation forms an electrical conduction channel, a drain and a source electrodes which exchange electrical charges with the semiconducting layer, and a gate electrode which is electrically isolated from the semiconducting layer by an dielectric layer.

There is a clear need to improve charge carrier injection and/or conductivity in organic electronic devices. Reducing or eliminating the barrier for charge injection between the electrode and the electron transport material (ETM) contributes strongly to enhancement of the device efficiency. Nowadays, there are two main approaches to reduce voltage and enhance efficiencies of organic electronic devices: improvement of the charge carrier injection and improvement of the conductivity of the transport layers. Both approaches can be used in combination.

For instance, U.S. Pat. No. 7,074,500 discloses a component structure for an OLED which leads to a greatly improved charge carrier injection from the electrodes into the organic layers. This effect is based on considerable band bending of the energy levels in the organic layer at the interface to the electrodes, as a result of which injection of charge carriers on the basis of a tunnel mechanism is possible. The high conductivity of the doped layers also prevents the voltage drop which occurs there during operation of the OLED. The injection barriers which may occur in OLEDs between the electrodes and the charge carrier transport layers are one of the main causes for an increase in the operating voltage compared to the thermodynamically justified minimum operating voltages. For this reason, many attempts have been made to reduce the injection barriers, for example by using cathode materials with a low work function, for example metals such as calcium or barium. However, these materials are highly reactive, difficult to process and are only suitable to a limited extent as electrode materials. Moreover, any reduction in operating voltage brought about by using such cathodes is only partial.

Metals having low work function, in particular alkali metals such as Li and Cs, are often used either as the cathode material or the injection layer to promote electron injection. They have also widely been used as dopants in order to increase the conductivity of the ETM, U.S. Pat. Nos. 6,013, 384, 6,589,673. Metals such as Li or Cs provide a high conductivity in matrixes which are difficult to dope otherwise (e.g. BPhen, Alq3).

However, the use of low work function metals has several disadvantages. It is well known that the metals can easily diffuse through the semiconductor, eventually arriving at the optically active layer quenching the excitons, thereby lowering the efficiency of the device and the lifetime. Another disadvantage is their high susceptibility to oxidation upon exposure to air. Therefore, devices using such metals as dopants, injection or cathode material require rigorous exclusion of air during production and rigorous encapsulation afterwards. Another well known disadvantage is that higher molar doping concentration of the dopant exceeding 10 mol. % may increase the undesired absorption of light in the transport layers. Yet another problem is high volatility of many simple redox dopants like Cs, leading to cross-contamination in the device assembling process making their use in device fabrication tools less attractive.

Another approach to replace metals as n-dopants and/or injection materials for ETM is the use of compounds with strong donor properties, such as tetrakis(1,3,4,6,7,8-hexahydro-2H-pyrimido[1,2-a]pyrimidinato)ditungsten (II) (W2(hpp)4) or Co(Cp*)2 (US2009/0212280, WO2003/088271) which have similar or slightly less doping/injecting ability in comparison with alkaline earth metals. Due to their still high enough electron donating capability, they are also undergoing rapid decay upon exposure to air, making their handling in device production difficult.

It is also known to mix metal organic complexes such as lithium quinolate (LiQ) into an electron transport layer to improve the device, however the exact mechanism of improvement is not well known. Investigations have shown that the use of LiQ still leads to OLEDs with high operating voltage.

Therefore, it is very desirable to provide materials which possess high doping/charge injection capability allowing for highly efficient organic electronic devices substantially preserving the long-term stability of the device and which are infinitely stable in air.

It is therefore an objective of the present invention to provide an organic electronic device, which overcomes state of the art limitations mentioned above and have improved performance compared to electronic devices of the prior art. It is especially an object, to provide an organic electronic device having reduced operating voltage and longer life time reflecting into higher power efficiency.

BRIEF SUMMARY

The object is achieved by an organic electronic device, comprising a first electrode, a second electrode, and a substantially organic layer comprising a compound according to formula (I) between the first and the second electrode:

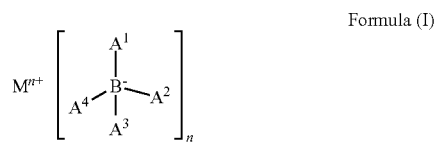

Formula (I)

wherein M is a metal ion, each of A1-A4 is independently selected from H, substituted or unsubstituted C6-C20 aryl and substituted or unsubstituted C2-C20 heteroaryl and n is valency of the metal ion.

Preferably, n is 1 or 2. More preferably, M is an alkaline metal or an alkaline earth metal. Most preferably, M is Li or Mg. In one preferred embodiment the substantially organic layer comprises an electron transport matrix compound.

Other preferred embodiments are disclosed in the subclaims.

In a further preferred embodiment the electron transport matrix compound comprises an imidazole or a P=O functional group.

Moreover, the compound according to formula (I) and the electron transport matrix compound are preferably present in the substantially organic layer in the form of a homogeneous mixture.

DETAILED DESCRIPTION

It is to be understood that all carbon atoms covalently bound in a substituted aryl or heteroaryl rest are included in the overall count of carbon atoms specified for this carbon rest. The term C10 aryl thus for example comprises not only 1- or 2-naphtyl but also all isomeric butylphenyls, diethylphenyls, methyl-propylphenyls and tetramethylphenyls.

Further examples of an aryl are phenyl, tolyl, xylyl, 1,1'-biphenylyl. Heteroaryl may preferably comprise up to three heteroatoms selected independently from N, O and S. In one preferred embodiment, the heteroaryl is attached to through a nitrogen atom. Even preferably, the heteroaryl group is a diazolyl group. More preferably, the diazolyl group is pyrazolyl. Further examples of a heteroaryl are imidazolyl, triazolyl, indolyl, dimethylimidazolyl, dimethylpyrazolyl and like.

Furthermore, the organic electronic device may be selected from an organic light emitting diode, organic solar cell and organic field effect transistor.

Preferred is an organic electronic device wherein the device is an organic light emitting diode with the first electrode being an anode, the second electrode being a cathode, and the device further comprising a light emitting layer between the anode and the cathode and wherein the substantially organic layer is comprised between the cathode and the light emitting layer. Alternatively or in addition, the light emitting layer of the organic electronic device comprises a light emitting polymer.

Preferably is finally the use of a material according to formula (I) in an organic electronic device, especially as a dopant in and/or adjacent an electron transport layer of the device.

Preferred Uses

Preferably the compound according to formula (I) is used in transport and/or injection layers, more preferably in an electron transport layer and/or electron injection layer.

The chemical compounds according to formula (I) are air-stable and capable to be evaporated without decomposition. They are also soluble in a variety of solvents. This makes the compounds according to formula (I) particularly easy to use in manufacturing processes.

The inventive organic electronic device preferably comprises a layered structure including a substrate, an anode and a cathode, the at least one substantially organic layer being disposed within the layered structure between the anode and the cathode.

The substantially organic layer may further comprise an electron transport matrix compound. The electron transport material constitutes preferably 10 weight % or more of the substantially organic layer. This is to allow charge transport through the layer. More preferred is 40 wt % or more. For an electron transport layer, it is more preferred that the electron transport matrix is the main component of the layer.

As matrix materials for electron transport layers, use may be made for example of fullerenes, such as for example C60, oxadiazole derivatives, such as for example 2-(4-biphenyl)-5-(4-tert-butylphenyl)-1,3,4-oxadiazole, quinoline-based compounds such as for example bis(phenylquinoxalines), or oligothiophenes, perylene derivatives, such as e.g. perylenetetracarboxylic acid dianhydride, naphthalene derivatives such as e.g. naphthalenetetracarboxylic acid dianhydride, or other similar compounds known as matrices in electron transport materials.

It is preferred that the electron transport matrix compound comprises a phosphine oxide or imidazole functional group.

Compounds well suitable as electron transport materials are compounds from:
US2007/0138950, preferentially, compounds (1) and (2) on page 22, compounds (3), (4), (5), (6), and (7) on page 23, compounds (8), (9), and (10) on page 25, and compounds (11), (12), (13), and (14) on page 26, which compounds are incorporated herein by reference;
US2009/0278115 A1, preferentially, compounds (1) and (2) on page 18, which compounds are incorporated herein by reference;
compounds from US2007/0018154, preferentially the compounds of claim 10, formula 1-1, 1-2, 1-3, 1-4, 1-5, 1-6 on page 19, 1-7 to 1-146 on pages 20 to 26. Compounds from US2008/0284325 A1, preferentially compounds on page 4: 2-(4-(9,10-diphenylanthracen-2-yl)phenyl)-1-phenyl-1H-benzo[d]imidazole, 2-(4-(9,10-di([1,1'-biphenyl]-2-yl) anthracen-2-yl)phenyl)-1-phenyl-1H-benzo[d]imidazole, 2-(4-(9,10-di(naphthalen-1-yl) anthracen-2-yl)phenyl)-1-phenyl-1H-benzo[d]imidazole, 2-(4-(9,10-di(naphthalen-2-yl) anthracen-2-yl)phenyl)-1-phenyl-1H-benzo[d]imidazole, 2-(4-(9,10-di([1,1':3',1''-terphenyl]-5'-yl) anthracen-2-yl)phenyl)-1-phenyl-1H-benzo[d]imidazole, and the compound on page 5, which compounds are incorporated herein by reference;
naphthacene derivatives from US2007/0222373, preferentially, compounds (A-1) and (A-2) from page 17, compounds (A-3) from page 18 and (A-4) from page 19, which compounds are incorporated herein by reference;
compounds from US2008/0111473, preferentially, compound 1 on page 61, compound 2 on page 62, compounds 3 and 4 on page 63, compound 5 on page 64, and compound 6 on page 65, which compounds are incorporated herein by reference;
compound H-4 from page 20, and compounds (1) and (2) of page 12 of US2010/0157131, which compounds are incorporated herein by reference;
compounds from US2010/0123390, according to general formula (1), preferentially, compounds H4, H5 p.21, H7 p.22, H11, H12, H13 p.23, H16, and H18 p.24, which compounds are incorporated herein by reference;
US2007/0267970, preferentially 2-([1,1'-biphenyl]-4-yl)-1-(4-(10-(naphthalen-2-yl) anthracen-9-yl)phenyl)-2,7a-dihydro-1H-benzo[d]imidazole (compound 1), 2-([1,1'-biphenyl]-2-yl)-1-(4-(10-(naphthalen-2-yl)anthracen-9-yl)phenyl)-2,7a-dihydro-1H-benzo[d]imidazole (compound 2). Compound (C-1) from US2007/0196688, p. 18, which is incorporated herein by reference;

Other suitable compounds are 7-(4'-(1-phenyl-1H-benzo[d]imidazol-2-yl)-[1,1'-biphenyl]-4-yl)dibenzo[c,h]acridine (ETM1), (4-(dibenzo[c,h]acridin-7-yl)phenyl)diphenylphosphine oxide (ETM2), 7-(4-(1-phenyl-1H-benzo[d]imidazol-2-yl)phenyl)dibenzo[c,h]acridine (ETM5).

Suitable hole transport materials (HTM) can be, for instance HTM from the diamine class, where a conjugated system is provided at least between the two diamine nitrogens. Examples are N4,N4'-di(naphthalen-1-yl)-N4,N4'-diphenyl-[1,1'-biphenyl]-4,4'-diamine (HTM1), N4,N4, N4'', N4''-tetra([1,1'-biphenyl]-4-yl)-[1,1':4',1''-terphenyl]-4,4''-diamine (HTM2). The synthesis of diamines is well described in literature; many diamine HTMs are readily commercially available.

It will be understood that the aforementioned matrix materials may also be used in a mixture with one another or with other materials in the context of the invention. It will be understood that use may also be made of suitable other organic matrix materials which have semiconductive properties.

In another preferred embodiment, the substantially organic layer is present in a pn junction, the pn junction having at least two layers, namely a p- and n-layer, and optionally an interlayer i in between, wherein the interlayer i and/or the n-layer is (are) the substantially organic semiconducting layer.

The organic electronic device may additionally comprise a polymer semiconducting layer.

Most preferably, the organic electronic device is a solar cell or a light emitting diode. In an OLED, the compound of formula (I) does not work as a light emitter. The light emitted from the OLED is emitted from other components of the OLED, different from the compound of the formula (I).

The organic electronic device may be also a field effect transistor comprising a semiconducting channel, a source electrode, and a drain electrode, the substantially organic layer being provided in between the semiconducting channel and at least one of the source electrode and the drain electrode.

In a further most preferred embodiment, the substantially organic layer comprising the chemical compound according to formula (I) is an electron injection layer and/or an electron transport layer.

Any layers of the inventive organic electronic device, especially the substantially organic layer can be deposited by known techniques, such as vacuum thermal evaporation (VTE), organic vapour phase deposition, laser induced thermal transfer, spin coating, blade or slit coating, inkjet printing, etc. A preferred method for preparing the organic electronic device according to the invention is vacuum thermal evaporation.

Surprisingly, it was found that the inventive organic electronic device overcomes disadvantages of prior art devices and has in particular an improved performance compared to electronic devices of the prior art, for example with regard to efficiency.

Injection Layer

In a preferred embodiment, the substantially organic layer, having the compound according to formula (I) as its main component, is adjacent to a cathode, preferably between a cathode and one of an ETL (electron transport layer) or HBL (hole blocking layer). The present invention has the advantages that, especially for non-inverted structures, the simplest form is also the one with a significantly improved performance compared to the structure not using an injection layer. The compound according to formula (I) can be used as a pure layer and is then preferably the only layer between an electron transporting layer (ETL or HBL) and the cathode. In this regard for an OLED the EML (emitter layer) and ETL matrix can be the same if the emission zone is far from the cathode. In another embodiment, the ETL and the EML are layers of different composition, preferably of a different matrix.

Such a pure layer as injection layer in organic electronic devices has a preferable thickness between 0.5 nm and 5 nm.

The thickness of the layer comprising the compound according to formula (I) is the nominal thickness, such thickness is usually calculated from the mass deposited on a certain area by the knowledge of the material's density. For example, with vacuum thermal evaporation VTE, the nominal thickness is the value indicated by the thickness monitor equipment. In reality, since the layer is not homogeneous and not flat at least at one interface, its final thickness is difficult to measure, in this case, the average value can be used. The cathode in this regard is a conductive layer having optionally any surface modifications to modify its electrical properties, e.g. to improve its work-function or conductivity. Preferably, the cathode is a double layer, more preferably it is a single layer to avoid complexity.

Semiconducting Layer

It is even preferred that the organic layer is an electron transport layer adjacent to the cathode and comprising the compound according to formula (I). If the ETL is directly adjacent to the cathode, this simplification has the advantage that no additional injection layer is required. Alternatively, an additional injection layer can be provided between the ETL and the cathode. This additional layer can be a layer having the chemical compound according to formula (I) as its main component, as already illustrated above. In one even preferred embodiment, the ETL is beneath the cathode (no other layer in between) wherein the cathode is the top electrode, which is formed after forming the ETL (non-inverted structure).

For an OLED the EML (emitter layer) and ETL matrix can be the same if the emission zone is far from the cathode. In another embodiment, the ETL and the EML are layers of different composition, preferably of a different matrix.

Advantages of the Invention

Surprisingly, it was observed an improvement of the OLED lifetime, and a lowering of the operating voltage.

Polymer Hybrid OLED or Solar Cell

In a further preferred embodiment the substantially organic layer comprising the chemical compound according to formula (I) is used in combination with a polymer semiconductor, preferably between a cathode and a polymer layer, wherein the polymer layer preferably comprises the optoelectronic active region of the device (emitting region of an OLED or the absorbing region of a solar cell). All alternatives of layers comprising the chemical compound according to formula (I) or being composed thereof can be used in combination with that polymer layer. Exemplary alternative layers can be an injection layer being composed of the chemical compound according to formula (I), an injection layer comprising the chemical compound and a metal, an electron transport layer having the chemical compound with or without a metal. The electronic interface to the cathode is then strongly improved given the high electron injection capability of the chemical compound (I).

Electrical Doping

The invention can be used as an alternative to conventional doping of organic semiconducting layers. By using the term doping it is meant electrical doping as explained above. This doping can also be called redox-doping or charge transfer doping. It is known that the doping increases the density of charge carriers of a semiconducting matrix towards the charge carrier density of the undoped matrix. An electrically doped semiconductor layer also has an increased effective mobility in comparison with the undoped semiconductor matrix.

US2008227979 discloses in detail the doping of organic transport materials, also called ma-trix, with inorganic and with organic dopants. Basically, an effective electronic transfer occurs from the dopant to the matrix increasing the Fermi level of the matrix. For an efficient trans-fer in a p-doping case, the LUMO energy level of the dopant is preferably more negative than the HOMO energy level of the matrix or at least slightly more positive, not more than 0.5 eV, to the HOMO energy level of the matrix. For the n-doping case, the HOMO energy level of the dopant is preferably more positive than the LUMO energy level of the matrix or at least slightly more negative, not lower than 0.5 eV, to the LUMO energy level of the matrix. It is further more desired that the energy level difference for energy transfer from dopant to matrix is smaller than +0.3 eV.

Typical examples of doped hole transport materials are: copperphthalocyanine (CuPc), which HOMO level is approximately-5.2 eV, doped with tetrafluoro-tetracyanoquinonedimethane (F4TCNQ), which LUMO level is about −5.2 eV; zincphthalocyanine (ZnPc) (HOMO=−5.2 eV) doped with F4TCNQ; a-NPD (N,N'-Bis(naphthalen-1-yl)-N,N'-bis(phenyl)-benzidine) doped with F4TCNQ.

One of the preferred modes of the invention is an OLED with the hole transporting side of OLED comprising a p-dopant and the electron transporting side comprising the material according to Formula (I). For example: an OLED with a p-doped HTL and an ETL with a ETM and the material according to Formula (I).

Organic Electronic Devices

Figure 1:
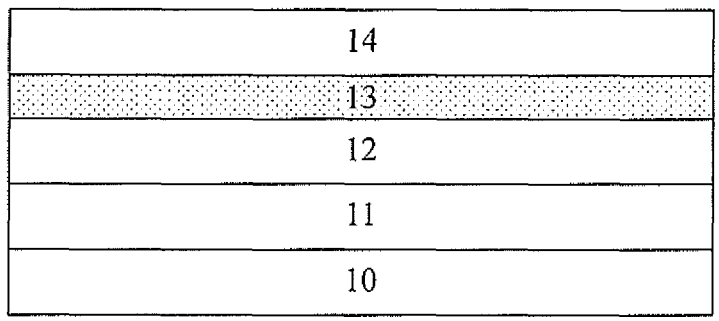
FIG. 1 illustrates a first embodiment of an inventive organic electronic device.

FIG. 1 illustrates a first embodiment of an inventive organic electronic device in the form of a stack of layers forming an OLED or a solar cell. In FIG. 1, 10 is a substrate, 11 is an anode, 12 is an EML or an absorbing layer, 13 is a EIL (electron injection layer), 14 is a cathode.

The layer 13 can be a pure layer of a compound according to formula (I). At least one of the anode and cathode is at least semi-transparent. Inverted structures are also foreseen (not illustrated), wherein the cathode is on the substrate (cathode closer to the substrate than the anode and the order of the layers 11-14 is reversed). The stack may comprise additional layers, such as ETL, HTL, etc.

Figure 2:
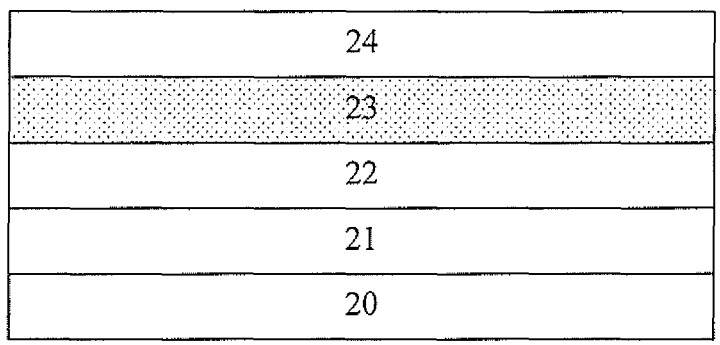
FIG. 2 illustrates a second embodiment of an inventive organic electronic device.

FIG. 2 represents a second embodiment of the inventive organic electronic device in the form of a stack of layers forming an OLED or a solar cell. Here, 20 is a substrate, 21 is an anode, 22 is an EML or an absorbing layer, 23 is an ETL, 24 is a cathode. The layer 23 comprises an electron transport matrix material and a compound according to formula (I).

Figure 3:
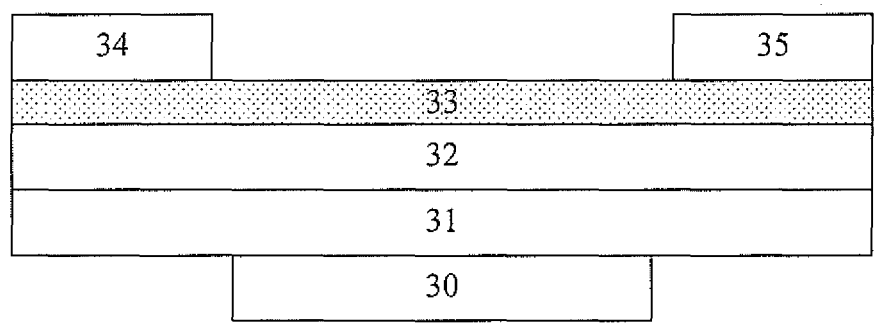
FIG. 3 shows a third embodiment of an inventive organic electronic device.

FIG. 3 illustrates a third embodiment of the inventive device in the form of an OTFT, with semi-conductor layer 32, a source electrode 34 and a drain electrode 35. An unpatterned (unpatterned between the source and drain electrodes) injection layer 33 provides charge carrier injection and extraction between the source-drain electrodes and semi-conducting layer. OTFT also comprises a gate insulator 31 (which could be on the same side as the source drain electrodes) and a gate electrode 30, which gate electrode 30 is on the side of the layer 31 which is not in contact with the layer 32. Obviously, the whole stack could be inverted. A substrate may also be provided. Alternatively, insulator layer 31 may be the substrate.

EXAMPLES

Compounds used as electron transporting matrices for testing the effects of inventive compounds

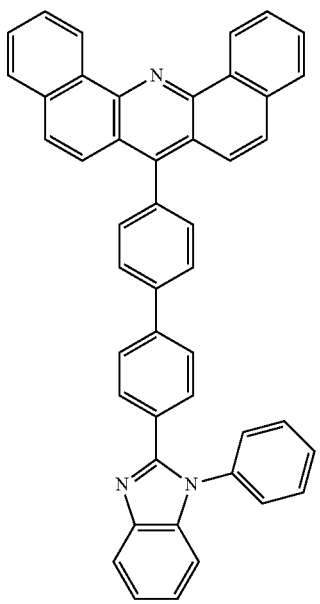

ETM1

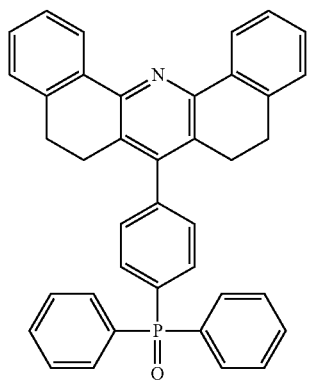

ETM2

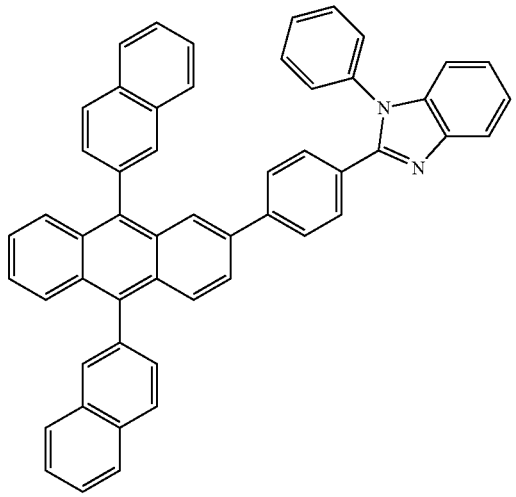

ETM3

ETM1 and ETM2 were described in patent application WO2011/154131 (Examples 4 and 6), ETM3 (CAS number 561064-11-7) is commercially available. ETM4 was synthesized from the intermediate (10) described in Example 3 of WO2011/154131 according to following procedure:

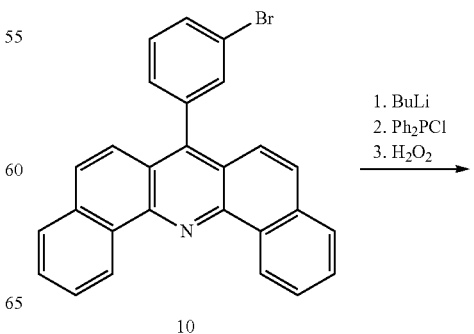

1. BuLi
2. Ph$_2$PCl
3. H$_2$O$_2$

10

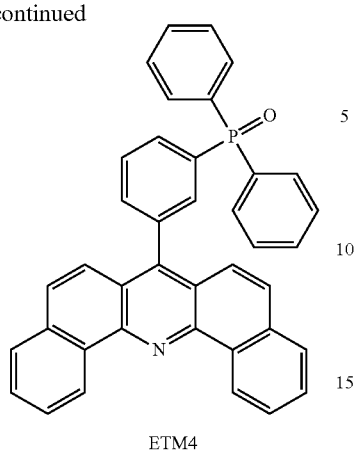

ETM4

(10) (4.06 g, 9.35 mmol) was dissolved in 60 mL dry THF under argon. The solution was cooled down to −78° C., n-butyllithium was added dropwise within 25 min (2.5 mol/L, 5.6 mL, 14.0 mmol), and the reaction mixture stirred at that temperature for half an hour. The temperature was then let rise up to −50° C., and diphenylphosphine chloride (2.17 g, 9.82 mmol) was added. The mixture was stirred overnight at room temperature. The reaction was then quenched with methanol (MeOH, 30 mL), and the solvents were evaporated. The solid residue was dissolved in 50 mL dichloromethane (DCM), 8 mL aqueous H2O2 (30% by weight) was then added and the mixture was stirred for 24 hours. The reaction mixture was then washed with 50 mL brine and 2×50 mL water, the organic phase was dried and evaporated. The crude product was purified via column chromatography (SiO2, DCM, then DCM/MeOH 99:1). The obtained foamy product was then washed two times with 40 mL acetonitrile.

Yield: 3.1 g (60%). Pale yellow solid.

NMR: $^{31}$P NMR (CDCl$_3$, 121.5 MHz): δ (ppm): 27 (m) $^1$H NMR (500 MHz, CD$_2$Cl$_2$) δ (ppm): 9.78 (d, 8.03 Hz, 2H), 7.95 (m, 3H), 7.85 (m, 2H), 7.76 (m, 11H), 7.57 (ddd, 1.39 Hz, 9.84 Hz, 7.24 Hz, 2H), 7.50 (m, 6H).

m.p. 250° C. (from differential scanning calorimetry (DSC) peak).

Synthetic Procedure for Preparing Compounds of Formula (I)

All reactions were performed under inert atmosphere. Commercial reactants and reagents were used without further purification. Reaction solvents tetrahydrofuran (THF), acetonitrile (AcN) and dichloromethane (DCM) were dried by a solvent purification system (SPS).

1) Synthetic Scheme for the Synthesis of lithium phenyltri(1H-Pyrazol-1-Yl)borate (1)

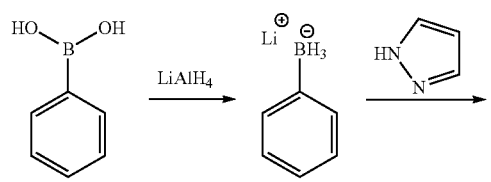

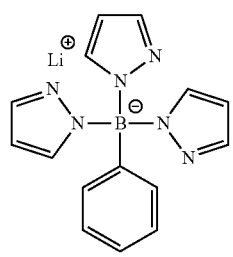

1.1) Lithium phenyltrihydroborate

A solution of 5.2 g (42.6 mmol, 1 eq.)phenylboronic acid in 30 mL dry diethyl ether was cooled to −5° C. A suspension of lithium aluminium hydride (LAH, 2.75 g, 72.4 mmol, 1.7 eq.) in 40 mL dry diethyl ether was added in portions to the first solution over 40 minutes. Mixture went back to room temperature and was stirred for another hour. Inert filtration of unreacted LAH rests through celite (the celite pad was washed with 2×20 mL dry diethyl ether) afforded, after evaporation of the solvent from the collected filtrate and drying under high vacuum 4.66 g crude solid material (grey powder) for which 1H-NMR in DMSO-d6 confirmed the structure. This crude product was used as such in the next step.

$^1$H-NMR (DMSO-d$_6$, 500.13 MHz): δ [ppm]=8.01 (m, 2H, Ar—H), 7.61 (t, J=7 Hz, 2H, Ar—H), 7.45 (t, J=7 Hz, 1H, Ar—H), 1.88 (m, 3H, 4 bands from $^{11}$B-$^1$H coupling).

1.2) Lithium phenyltri(1H-pyrazol-1-yl)borate (1)

In a sealed autoclave was mixed under argon 2.4 g (24.5 mmol, theoretically 1 eq.) 1.1) and 6.66 g (98 mmol, 4 eq.) pyrazole in 100 mL dry toluene. The reaction mixture was heated in the sealed vessel until 250° C. were reached, then maintained at this temperature over night. After returning to room temperature, reaction mixture was filtered and the obtained solid was washed with toluene to eliminate pyrazole rests. Obtained 5.0 g of a grey powder (69% yield). Further purification was achieved by gradient sublimation.

ESI-MS: 289 m/z.

$^1$H-NMR (CD$_3$OD, 500.13 MHz): δ [ppm]=6.15 (t, J=2 Hz, 2H), 6.95 (m, 2H), 7.09 (d, J=2 Hz, 3H), 7.11 (m, 3H), 7.54 (s, 3H).

2) Tri(1H-pyrazol-1-yl)hydroborate Complexes

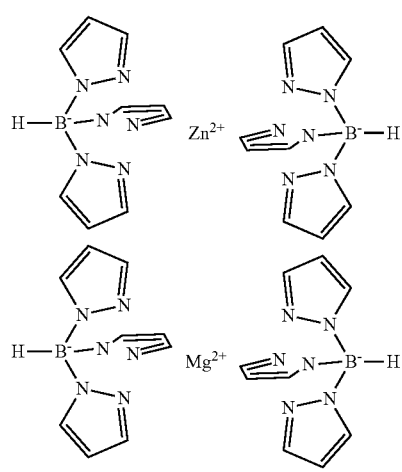

-continued

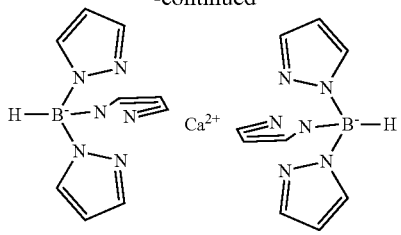

Synthesis of these complexes was achieved by following the procedures reported by S. Trofimenko in the following reference: Journal of the American Chemical Society, 89 (13), 3170-3177. Complexes of Zinc, Magnesium, and Calcium were synthesized.

2.1) Zinc (II) tri(1H-pyrazol-1-yl)hydroborate (2)

The above cited synthetic procedure was applied to the synthesis of this material.
Characterization: white powder
EI-MS: 489 m/z $[M-H]^{+1}$
Elem. An. C: 43.99% (calc. 43.99%); H: 4.20% (calc. 4.10%); N: 34.16% (calc. 34.20%).

2.2) Magnesium (II) tri(1H-pyrazol-1-yl)hydroborate (3)

The above cited synthetic procedure was applied to the synthesis of this material.
Characterization: white powder
EI-MS: 449 m/z $[M-H]^{+1}$ (from unsublimed material)

2.3) Calcium (II) tri(1H-pyrazol-1-yl)hydroborate (4)

The above cited synthetic procedure was applied to the synthesis of this material.
Characterization: white powder
EI-MS: 465 m/z $[M-H]^{+1}$ 2.4) Lithium tri(1H-pyrazol-1-yl)hydroborate (5)

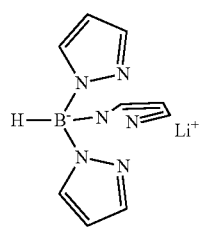

The above cited synthetic procedure was also applied to the synthesis of the lithium salt.
Characterization: white powder
EI-MS: 219 m/z $[M-H]^{+1}$
Elem. An. C: 49.06% (calc. 49.14%); H: 5.01% (calc. 4.58%); N: 38.20% (calc. 38.21%).

3) Magnesium tetra(1H-pyrazol-1-yl)borate (6)

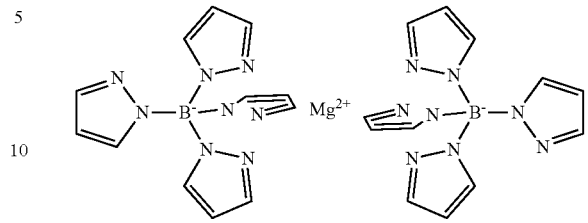

To a solution of 2.04 g (5.5 mmol, 1 eq.) of sodium tetra(1H-pyrazol-1-yl)borate in 100 mL water was added carefully a solution of magnesium chloride (262 mg, 2.8 mmol, 1 eq.) in 5 mL water followed by the addition of 40 mL of water. Mixture was stirred for 4 h, then filtered and the residue was washed with 300 mL of water in portions and dried in air, then under vacuum, to afford (6): 1.28 g (79%)
Characterization: white powder
EI-MS: 582 m/z $[M-H]^{+1}$ (unsublimed sample)
DSC (purity): 99.0% (m.p. 355° C.).

4) Lithiumium tetra(1H-pyrazol-1-yl)borate (7)

42.0 g (617 mmol) 1H-pyrazole and 3.23 g (147 mmol) lithium borohydride were mixed in an autoclave reactor and heated for 16 h at 250° C. After cooling to room temperature, the white solid was suspended in 120 ml toluene and stirred for an hour. After filtration, washing with toluene and drying in vacuo 28.93 g (69%) material was obtained. The material was purified by gradient sublimation. The C, H, N content (50.22%, 4.3%, 39, 17%) estimated by microanalysis fitted well the theoretical values (50.40%, 4.2%, 39.20%).

5) Sublimation Data

Table 1 shows that exemplary compounds of formula (I) are sufficiently stable to be applicable in processing of electronic devices by means of vacuum thermal evaporation (VTE) and their deposition as a layer on a proper solid substrate or by their co-deposition with an appropriate matrix compound to form a semiconducting material comprising both matrix as well as formula (I) compounds.

TABLE 1

| Compound | Melting Point (° C.) | Decomposition temperature (° C.) | Sublimation temperature (° C.) | Sublimation yield (%) |
| --- | --- | --- | --- | --- |
| 1 | 345 | 365 | 300 | 66 |
| 2 | 284 | >300 | 175 | 73 |
| 3 | 281 (unsublimed) | >300 (unsublimed) | 205 | 71 |
| 4 | 280 | 367 | 210 | 46 |
| 5 | 268 | 332 | 198 | 80 |
| 6 | 355 | >360 | 267 | 76 |

Device Examples

Comparative Example 1

A first blue emitting device was made by depositing a anode of 100 nm thick Ag on a glass substrate. A 40 nm doped layer of HTM2 (matrix to dopant weight ratio of 97:3) was subsequently deposited as hole injection and transport layer, followed by an 92 nm undoped layer of HTM2. Subsequently, an blue fluorescent emitting layer of ABH113 (Sun Fine Chemicals) doped with NUBD370 (Sun Fine Chemicals) (97:3 wt %) was deposited with a thickness of 20 nm. A 36 nm layer of the compound ETM1 was deposited on the emitting layer as ETL. A 1 nm thick layer of lithium quinolate (LiQ) followed the ETM1 layer. Subsequently a layer of Mg:Ag (90:10 wt %) with a thickness of 12 nm was deposited as transparent cathode followed by 60 nm of HTM2 as cap layer.

This device showed a voltage of 4.2 V at a current density of 10 mA/cm2, a luminance of 122 cd/m2 at a current density of 10 mA/cm2 with a current efficiency of 1.2 cd/A at the same current density.

In the whole stack HTM2 can be replaced by HTM1 with similar results.

Comparative Example 2

A similar device was produced as in Comparative Example 1, with the difference that the ETL was deposited as a 36 nm thick layer of a mixture between the ETM1 and LiQ with a weight ratio of 1:1.

This device showed a voltage of 4.0 V at a current density of 10 mA/cm2, a luminance of 260 cd/m2 at a current density of 10 mA/cm2 with a current efficiency of 2.6 cd/A at the same current density.

Inventive Example 1

A similar device was produced as in Comparative Example 1, with the difference that the ETL was deposited as a 36 nm thick layer of a mixture between the compound (7) and ETM1 with a weight ratio of 1:1.

This device showed a slightly increased voltage of 4.37 V at a current density of 10 mA/cm2, an extremely enhanced luminance of 663 cd/m2 at a current density of 10 mA/cm2 with a current efficiency of 6.6 cd/A at the same current density. These values are remarkable good for a blue emitting OLED. Given the high performance, it is possible to operate an OLED with same or higher light intensity than the OLEDs of the comparative examples at a lower voltage.

Comparative Example 3

A similar device was produced as in Comparative Example 1, with the difference that the ETL was deposited as a 36 nm thick layer of a mixture between the ETM2 and LiQ with a weight ratio of 1:1.

This device showed a voltage of 4.7 V at a current density of 10 mA/cm2, a luminance of 452 cd/m2 at a current density of 10 mA/cm2 with a current efficiency of 4.5 cd/A at the same current density.

Inventive Example 2

A similar device was produced as in Comparative Example 3, with the difference that the ETL was deposited as a 36 nm thick layer of a mixture between the ETM2 and the compound (7) with a weight ratio of 1:1.

This device showed a voltage of 4.3 V at a current density of 10 mA/cm2, a luminance of 673 cd/m2 at a current density of 10 mA/cm2 with a current efficiency of 6.7 cd/A at the same current density.

The only difference from this inventive example to the comparative example 3 is the compound according to Formula (I). With this replacement, the device had a surprising enhancement of all key figures, operating at a lower voltage, with higher considerable performance. The lifetime of the device was more than 50 h at to 97% of the initial luminance at a current density of 10 mA/cm2, which is considerable more than of the comparative example 2 with 37 h.

OLEDs with other ETMs and the compound according to Formula (I) showed similar performance improvements, as shows the Table 2:

| compound | ETL matrix | Voltage (V) at 10 mA/cm$^2$ | CIE 1931 x | CIE 1931 y | QEff (%) at 10 mA/cm$^2$ |
|---|---|---|---|---|---|
| (1) | 3 | 4.9 | 0.145 | 0.120 | 5.8 |
| (1) | 4 | 4.0 | 0.165 | 0.105 | 8.5 |
| (2) | 3 | 4.8 | 0.198 | 0.095 | 4.7 |
| (3) | 3 | 4.7 | 0.138 | 0.096 | 5.6 |
| (5) | 3 | 3.6 | 0.136 | 0.104 | 7.0 |
| (5) | 2 | 4.4 | 0.138 | 0.092 | 6.7 |
| (6) | 3 | 4.1 | 0.137 | 0.096 | 6.1 |
| (6) | 2 | 5.5 | 0.139 | 0.105 | 5.8 |
| (7) | 3 | 4.3 | 0.134 | 0.098 | 5.2 |
| (7) | 2 | 4.1 | 0.137 | 0.108 | 6.1 |
| (7) | 4 | 3.8 | 0.162 | 0.110 | 6.3 |
| LiQ | 3 | 4.3 | 0.132 | 0.108 | 5.1 |
| LiQ | 2 | 4.9 | 0.128 | 0.096 | 3.8 |
| LiQ | 4 | 4.7 | 0.142 | 0.104 | 4.7 |

These results show that the inventive devices comprising compounds of formula (I) are not only useful alternatives to the devices using known LiQ as an electron-injecting additive. Use of compounds of formula (I) significantly broadens the offer of electron transport improving additives, allowing improving and optimizing device performance beyond limits known in the art.

The features disclosed in the foregoing description, the claims and in the drawings may both separately and in any combination thereof, be material for realising the invention in diverse forms thereof.

The invention claimed is:

1. Organic electronic device, comprising a first electrode, a second electrode, and a substantially organic layer comprising a compound according to formula (I) between the first and the second electrode:

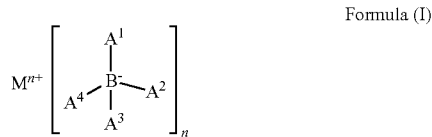

Formula (I)

wherein M is a metal ion, each of $A^1$-$A^4$ is independently selected from H, substituted or unsubstituted C6-C20 aryl and substituted or unsubstituted C2-C20 heteroaryl and n is valency of the metal ion, wherein at least three groups selected from $A^1$-$A^4$ are nitrogen containing heteroaryls, and wherein the substantially organic layer further comprises an electron transport material and the electron transport matrix comprises an imidazole or a P=O functional group.

2. Organic electronic device according to claim 1, wherein n is 1 or 2.

3. Organic electronic device according to claim 1, wherein M is an alkaline metal or an alkaline earth metal.

4. Organic electronic device according to claim 1, wherein nitrogen containing heteroaryl is bound to the central boron atom through a B—N bond.

5. Organic electronic device according to claim 4, wherein the heteroaryl is pyrazolyl.

6. Organic electronic device according to claim 1, wherein M is Mg or Li.

7. Organic electronic device according to claim 1, wherein the compound according to formula (I) and the electron transport matrix are present in the substantially organic layer in the form of a homogeneous mixture.

8. Organic electronic device according to claim 1, wherein the device is selected from an organic light emitting diode, organic solar cell and organic field effect transistor.

9. Organic electronic device according to claim 8, wherein the device is an organic light emitting diode with the first electrode being an anode, the second electrode being a cathode, and the device further comprising a light emitting layer between the anode and the cathode and wherein the substantially organic layer is comprised between the cathode and the light emitting layer.

10. Organic electronic device according to claim 9, wherein the light emitting layer comprises a light emitting polymer.

11. A method for improving the charge carrier transport and/or the electron injection in and/or adjacent an electron transport layer of an organic electronic device, the method comprising:
disposing a compound according to formula (I),

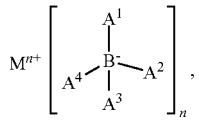

Formula (I)

wherein M is a metal ion, each of $A^1$-$A^4$ is independently selected from H, substituted or unsubstituted C6-C20 aryl and substituted or unsubstituted C2-C20 heteroaryl and n is valency of the metal ion,
in a substantially organic layer comprised in the organic electronic device, wherein the substantially organic layer further comprises an electron transport matrix material and the electron transport matrix material comprises an imidazole or a P=O functional group.

12. Organic electronic device according to claim 1, wherein the electron transport matrix material comprises the P=O functional group.

* * * * *